United States Patent
Kozuka et al.

(10) Patent No.: US 7,151,305 B2
(45) Date of Patent: Dec. 19, 2006

(54) PHOTOELECTRIC CONVERSION DEVICE, AND IMAGE SENSOR AND IMAGE INPUT SYSTEM MAKING USE OF THE SAME

(75) Inventors: Hiraku Kozuka, Hiratsuka (JP); Takahiro Kaihotsu, Chigasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 11/088,777

(22) Filed: Mar. 25, 2005

(65) Prior Publication Data
US 2005/0167710 A1    Aug. 4, 2005

Related U.S. Application Data

(62) Division of application No. 09/511,358, filed on Feb. 23, 2000, now Pat. No. 6,878,977.

(30) Foreign Application Priority Data
Feb. 25, 1999   (JP)   ............... 11-049065

(51) Int. Cl.
 H01L 27/14 (2006.01)
 H01L 31/00 (2006.01)
 H01L 31/0232 (2006.01)
 H01L 31/06 (2006.01)

(52) U.S. Cl. ............ 257/431; 257/432; 257/439; 257/461; 257/462; 257/463; 257/464; 257/465

(58) Field of Classification Search ........ 257/431–432, 257/439, 461–465
See application file for complete search history.

(56) References Cited

U.S. PATENT DOCUMENTS

| | | | | |
|---|---|---|---|---|
| 4,622,567 A | * | 11/1986 | Pals et al. ............... | 348/308 |
| 4,689,687 A | * | 8/1987 | Koike et al. ............ | 348/322 |
| 4,737,832 A | * | 4/1988 | Kyuma .................... | 257/291 |
| 4,839,735 A | * | 6/1989 | Kyomasu et al. ........ | 348/297 |
| 4,972,243 A | | 11/1990 | Sugawa et al. .......... | 357/30 |
| 4,982,079 A | | 1/1991 | Yagyu .................... | 250/208.1 |
| 5,061,978 A | | 10/1991 | Mizutani et al. ........ | 357/30 |
| 5,084,747 A | * | 1/1992 | Miyawaki ............... | 257/432 |
| 5,101,252 A | | 3/1992 | Matsumoto ............. | 357/30 |
| 5,101,253 A | * | 3/1992 | Mizutani et al. ........ | 257/414 |
| 5,106,765 A | | 4/1992 | Mizutani et al. ........ | 437/31 |
| 5,121,225 A | | 6/1992 | Murata et al. .......... | 358/471 |
| 5,453,629 A | | 9/1995 | Gofuku et al. .......... | 257/186 |
| 5,481,124 A | | 1/1996 | Kozuka et al. ......... | 257/185 |
| 5,500,550 A | | 3/1996 | Morishita ............... | 257/461 |
| 5,677,201 A | | 10/1997 | Kozuka et al. ......... | 437/3 |
| 5,770,872 A | * | 6/1998 | Arai ...................... | 257/257 |
| 5,861,655 A | | 1/1999 | Kozuka et al. ......... | 257/446 |

(Continued)

FOREIGN PATENT DOCUMENTS

JP    55-154784    12/1980

(Continued)

*Primary Examiner*—Ida M. Soward
(74) *Attorney, Agent, or Firm*—Fitzpatrick, Cella, Harper & Scinto

(57) ABSTRACT

In a photoelectric conversion device including a first-conductivity type first semiconductor region located in a pixel region, a second-conductivity type second semiconductor region provided in the first semiconductor region, and a wiring for electrically connecting the second semiconductor region to a circuit element located outside the pixel region, a shield is provided on the light-incident side of the wiring, via an insulator in such a way that it covers at least part of the wiring and also the shield includes a conductor whose potential stands fixed. This photoelectric conversion device may hardly be affected with low-frequency radiated noises as typified by power-source noise.

6 Claims, 9 Drawing Sheets

U.S. PATENT DOCUMENTS

| | | | |
|---|---|---|---|
| 5,904,493 A * | 5/1999 | Lee et al. | 438/57 |
| 5,985,689 A | 11/1999 | Gofuku et al. | 438/59 |
| 6,002,157 A * | 12/1999 | Kozuka | 257/369 |
| 6,043,550 A | 3/2000 | Kuhara et al. | 257/461 |
| 6,111,271 A | 8/2000 | Snyman et al. | 257/80 |
| 6,169,317 B1 * | 1/2001 | Sawada et al. | 257/435 |
| 6,188,093 B1 | 2/2001 | Isogai et al. | 257/230 |
| 6,878,977 B1 * | 4/2005 | Kozuka et al. | 257/184 |

FOREIGN PATENT DOCUMENTS

| | | |
|---|---|---|
| JP | 61-264758 | 11/1986 |
| JP | 64-014958 | 1/1989 |
| JP | 1-303752 | 12/1989 |
| JP | 6-302798 | 4/1993 |
| JP | 9-205588 | 8/1997 |

* cited by examiner

PHOTOELECTRIC CONVERSION DEVICE, AND IMAGE SENSOR AND IMAGE INPUT SYSTEM MAKING USE OF THE SAME

This application is a division of U.S. application Ser. No. 09/511,358, filed Feb. 23, 2000 now U.S. Pat. No. 6,878,977, the entire content of which is incorporated herein by reference.

BACKGROUND OF THE INVENTION

1. Field of the Invention

This invention relates to an image scanner, a facsimile transmission system and other image input systems, or image sensors of various types, and a photoelectric conversion device (or photoelectric transducer) used in them. More particularly, it relates to an improvement of pixel (picture element) structure.

2. Related Background Art

Photoelectric conversion devices are widely used in the above image input systems and image sensors.

As generally known examples, CCD image sensors making use of a reduction optical system and non-reduction contact type image sensors multiple-mounted with a plurality of semiconductor photosensor chips are used in, e.g., image scanners for inputting images. These are being developed energetically.

As photodetectors used as photoelectric conversion devices in these systems and sensors, it is common to use photodiodes comprising a semiconductor p-n junction. For example, as disclosed in Japanese Patent Application Laid-Open No. 55-159784, a structure is proposed in which a substrate having no p-n junction formed therein is provided, on its surface, with a region having the same conductivity type as the substrate and also having a higher impurity density than the substrate so that the dark current may less occur on the substrate surface. Also, as photodetectors for one-dimensional photoelectric conversion devices, proposed in variety are, e.g., a photodetector whose junction capacitance formed by p-n junction has been made small as disclosed in Japanese Patent Application Laid-Open No. 61-264758 and a photodetector in which the dark current ascribable to the scribed area at chip ends has been designed to less occur as disclosed in Japanese Patent Application Laid-Open No. 1-303752.

Meanwhile, as disclosed in, e.g., Japanese Patent Application Laid-Open No. 9-205588, an amplification type photoelectric conversion device is proposed in which a photodiode is used as a photodetector and electric charges of this photodetector are full read by using a source follower amplifier.

In the case of the above amplification type photoelectric conversion device, its light output Vp is expressed by Equation (1).

$$Vp = Qp/Co \times G \qquad (1)$$

where Qp is a quantity of electric charges accumulated at the p-n junction, Co is a capacitance at the photoelectric conversion area, G is an amplification degree determined by source follower gain, capacitance-dividing gain, amplifying gain and so forth.

In the case of an amplification type photoelectric conversion device having, e.g., a photodiode, an MOS source follower transistor and a reset MOS transistor, this capacitance Co at the photoelectric conversion area can be expressed by:

$$Co = Cpd + Ca \qquad (2)$$

where Cpd is a p-n junction capacitance of a p-n photodiode, and Ca is other capacitance connected to the photoelectric conversion area, which includes, in the above case, source/well junction capacitance of the reset MOS transistor, source/gate overlap capacitance, wiring capacitance and the like.

Accordingly, in order to achieve a high sensitivity, it is important to accumulate photoelectric carriers (carriers formed upon exposure to light) effectively and make as small as possible the capacitance at the photoelectric conversion area at which the carriers are accumulated.

In general, the reset noise produced when a photodetector is reset increases with a decrease in capacitance at the photoelectric conversion area. However, as disclosed in the above Japanese Patent Application Laid-Open No. 9-205588, the reset noise can be eliminated by providing a means for retaining noise signals occurring immediately after resetting, and subtracting noise signals from light signals.

However, in such a photoelectric conversion device in which the noise signals occurring immediately after the resetting of a photodetector are retained during accumulation and subtracted from light signals to eliminate the reset noise of the photodetector, some external noises radiated from the outside of the photoelectric conversion device, in particular, low-frequency noises such as power-source noise may lower image quality.

Now, where the capacitance at the photoelectric conversion area is represented by $C_o$, the amplification degree by G and the quantity of photoelectric charges accumulated at the photoelectric conversion area during accumulation by $Q_P$, noise output $V_N$ immediately after the resetting of a photodetector, the quantity of noise charges by $Q_N$ and light output $V_S$ after accumulation are expressed by:

$$V_N = (\sqrt{kTC_o}/C_o) \times G = (Q_N/C_o) \times G \qquad (3)$$

and $$V_S = ((Q_N + Q_P)/C_o) \times G \qquad (4),$$

respectively, and the subtraction made between Equations (3) and (4) gives the following equation as light signals $V_P$.

$$V_P = V_S - V_N = ((Q_P + Q_N - Q_N)/C_O) \times G = (Q_P/C_O) \times G \qquad (5)$$

However, once, e.g., a low-frequency noise of about 50 Hz radiated from a power source of an instrument has mixed into a photodetector, it becomes impossible to eliminate the noise by the subtraction. Especially in the case of the above prior art, the timing at which the noise signals and light signals for which the subtraction is to be made has deviated by the time substantially corresponding to the time of accumulation and also the node of the photodetector during accumulation has come to have a very high impedance in the state of floating, and hence this external noise brings about a very great influence.

Now, where external-noise voltage present in the photodetector at a time $(t_1)$ where the noise signals occurring immediately after resetting are read is represented by $V_{N1}$, and external-noise electric charges present in the photodetector at a time $(t_2)$ where the light output is read after accumulation by $V_{N2}$, light signals $V_P'$ after the subtraction corresponding to the above Equation (5) is as follows:

$$V_P'=((Q_P/C_o)+V_{N2}-V_{N1})\times G \qquad (6).$$

Also when an external noise having an amplitude $V_{NR}$ and a frequency $f_o$ (Hz) is radiated to the photodetector and as long as the noise voltage in the node of the photodetector is $\Delta V_{NR}$, the noise voltage at the photodetector node at an arbitrary time t is expressed by:

$$\Delta V_{NR}(t)=\Delta V_{NR}\times\sin(2\pi f_o\times t) \qquad (7).$$

Now, where the amplitude of external noise in the photodetector, $\Delta V_{NR}$, is set at 2±1 (an arbitrary unit), the frequency ($f_o$) of the external noise at 50 Hz and the accumulation time of the photoelectric conversion device at 2.5 msec;

noise signal read time: $t_n$ (msec);
external noise at the time: $t_n$: $V_{N1}$;
time at the reading of light signals: $t_s$ (msec);
external noise at the time $t_s$: $V_{N2}$; and
subtraction of external noise: $\Delta V_N (=V_{N2}-V_{N1})$ at each field are given as shown in Table 1.

TABLE 1

| Field number | $t_n$ | $V_{N1}$ | $t_s$ | $V_{N2}$ | $\Delta V_N$ |
|---|---|---|---|---|---|
| 1 | 0 | 0 | 2.5 | 0.707 | 0.707 |
| 2 | 2.5 | 0.707 | 5.0 | 1.0 | 0.293 |
| 3 | 5.0 | 1.0 | 7.5 | 0.707 | −0.293 |
| 4 | 7.5 | 0.707 | 10.0 | 0 | −0.707 |
| 5 | 10.0 | 0 | 12.5 | −0.707 | −0.707 |
| 6 | 12.5 | −0.707 | 15.0 | −1.0 | −0.293 |
| 7 | 15.0 | −1.0 | 17.5 | −0.707 | 0.293 |
| 8 | 17.5 | −0.707 | 20.0 | 0 | 0.707 |
| 9 | 20.0 | 0 | 22.5 | 0.707 | 0.707 |
| 10 | 22.5 | 0.707 | 25.0 | 1.0 | 0.293 |
| 11 | 25.0 | 1.0 | 27.5 | 0.707 | −0.293 |
| 12 | 27.5 | 0.707 | 30.0 | 0 | −0.707 |
| 13 | 30.0 | 0 | 32.5 | −0.707 | −0.707 |
| 14 | 32.5 | −0.707 | 35.0 | −1 | −0.293 |

As can be seen from the above table, mutual interferences between noise frequency and accumulation time cause periodic changes in output after subtraction.

Hence, in the case where e.g., all pixels of a photoelectric conversion device are read simultaneously, the above changes in output after the subtraction correspond to changes in the amount of offset in the direction of secondary scanning. Stated specifically, they appear as periodic stripe-like light and shade in images thus read.

SUMMARY OF THE INVENTION

An object of the present invention is to provide a photoelectric conversion device that may hardly be affected with radiated noises, in particular, a low-frequency radiated noise typified by power-source noise, and can read images in a high quality, and to provide an image sensor or image input system making use of such a device.

The photoelectric conversion device of the present invention comprises:

a first-conductivity type first semiconductor region located in a pixel region;

a second-conductivity type second semiconductor region provided in the first semiconductor region and capable of accumulating photoelectric carriers in a floating state;

a wiring for electrically connecting the second semiconductor region to a circuit element located outside the pixel region; and a conductor provided on the wiring located inside the pixel region, via an insulator and capable of being kept at a stated potential.

The second semiconductor region may be an island-shaped region surrounded by the first semiconductor region.

The second semiconductor region may also have a first part which is the island-shaped region surrounded by the first semiconductor region and a second part surrounding the first part and having a lower impurity density than the first semiconductor region.

The conductor may be formed integrally with a light-screening layer provided for defining the pixel region.

The circuit element may be an MOS transistor. Then the circuit element may comprise a resetting switch for resetting the potential of the second semiconductor region and an amplifying transistor for amplifying signals.

To the circuit element, an accumulation circuit for accumulating a reset noise and a noise-reduction circuit for reducing the reset noise may be connected.

The conductor may have either width of a width smaller than the width of the wiring or a width larger than the width of the wiring.

The photoelectric conversion device may have a terminal connected to a power source for keeping the conductor at a stated potential.

The photoelectric conversion device may be provided in combination with a light source and an imaging device to make up an image sensor.

In this image sensor, the photoelectric conversion device may be provided in plurality in a one-dimensional fashion or zigzag (staggered) fashion on a mounting substrate. This image sensor has a wiring for supplying a reference voltage for keeping the conductor at a stated potential.

This image sensor may be provided in combination with an original-holding means for holding an original and a control circuit for controlling the image sensor, to make up an image input system.

In this image input system, the original-holding means may comprise an original stand having a transparent top surface, or an original-carrying holding-down member. This system may also have a reference voltage source that supplies a reference voltage for keeping the conductor at a stated potential.

In the photoelectric conversion device, the conductor, which serve as a shield, may comprise a conductor extending into a substantially square opening formed in a light-screening layer to define the pixel region, and extending along the wiring located inside the pixel region. This enables the pixel region to be kept from having a large capacitance.

DETAILED DESCRIPTION OF THE PREFERRED EMBODIMENTS (Embodiment 1)

Figure 1:
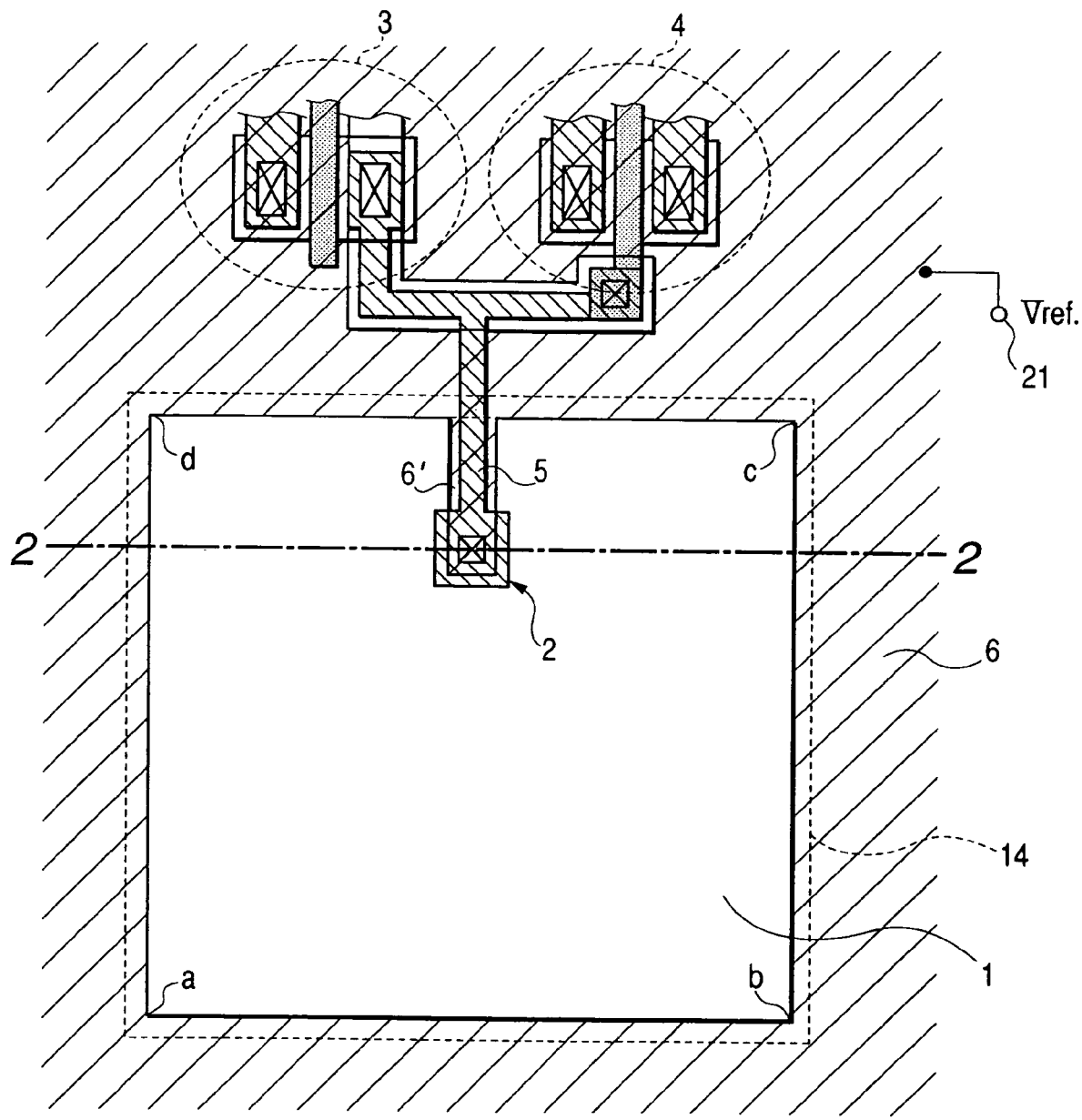
FIG. 1 illustrates a planar structure of a photodetector in Embodiment 1 of the present invention.
Figure 2:
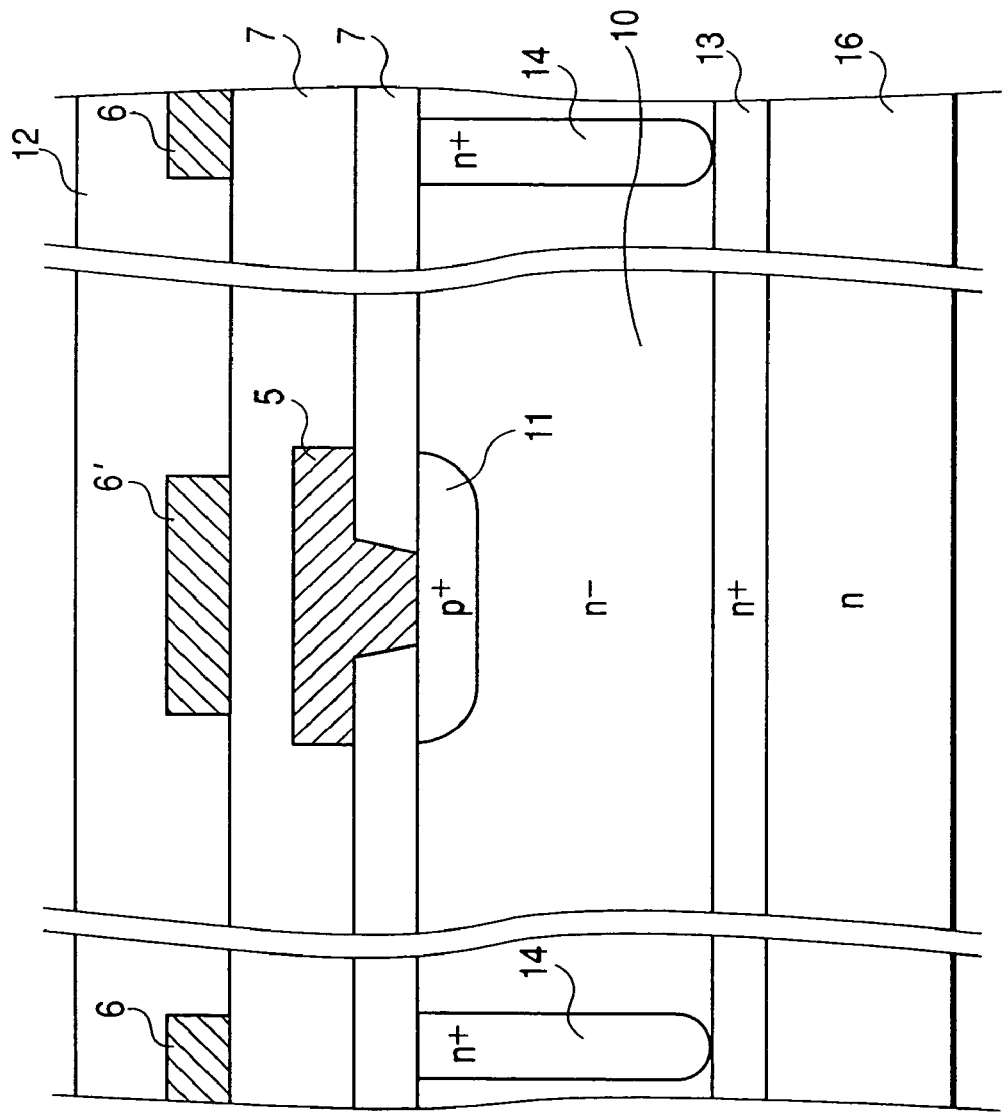
FIG. 2 is a cross-sectional view along the line 2—2 in FIG. 1.

FIG. 1 illustrates a planar structure of a photodetector as a photoelectric conversion device according to the present invention. FIG. 2 illustrates a cross-sectional structure along the line 2—2 in FIG. 1.

The photoelectric conversion device according to the present embodiment comprises:

an $n^-$-type region 10 as a first-conductivity type first semiconductor region, located in a pixel region (a pixel region opening; hereinafter merely "opening") 1;

a $p^+$-type region 11 as a second-conductivity type second semiconductor region, provided in the first semiconductor region 10, where in a floating state, the first semiconductor region 10 may accumulate photoelectric carriers therein;

a wiring 5 for electrically connecting the second semiconductor region 11 to circuit elements 3 and 4 located outside the pixel region 1; and a conductor 6' provided on the wiring 5 located inside the pixel region, via an insulator 7 and kept at a stated potential.

The conductor 6' stands extended into the opening.

The present photoelectric conversion device will be described below in detail.

In the pixel region 1, a photodiode 2 serving as a photodetector is formed. The photodiode 2 is electrically connected to the drain of a reset MOS transistor 3 and the gate of an amplifying source follower MOS transistor 4 which are the circuit elements, through a wiring 5 formed of a first metal layer. Also, the pixel region 1 of the photodetector corresponds to an opening roughly defined by a light-screening layer 6 formed of a second metal layer and this light-screening layer 6 is connected to a reference voltage-source so as to be kept at a stated potential.

As shown in FIG. 2, the photodetector is formed by providing an anode comprising the $p^+$-type region 11 formed in an island shape in the $n^-$-type region 10 located in the pixel region 1. Needless to say, the conductivity type may be reversed so as to form in a $p^-$-type region a cathode comprising an $n^+$-type region.

Beneath the $n^-$-type region 10, an $n^+$-type buried region 13 is provided, which is formed on an n-type semiconductor substrate 16. This construction can be materialized by, e.g., forming an area for the $n^+$-type buried region 13 on the n-type semiconductor substrate 16 by ion implantation followed by epitaxy to grow that region.

Beneath the light-screening layer 6 formed of a second metal layer, an $n^+$-type region 14 is provided in a ring shape as viewed from above and in such a way that it holds the $p^+$-type region 11 on its inside. This $n^+$-type region 14 and the $n^+$-type buried region 13 cooperate to form a potential barrier against photoelectric carriers generated in the pixel region. This enables effective collection of photoelectric carriers in the $p^+$-type region 11 even when the $p^+$-type region 11 is formed in the shape of an independent island and also enables achievement of a low capacitance in the pixel region.

The $p^+$-type region 11 is further electrically connected with the wiring 5 formed of a first metal layer. Above the wiring 5, as the conductor an in-pixel-region shield 6' formed of a second metal layer is provided via an insulating layer 7, and a protective layer 12 is provided above the second metal layer.

Here, what is most characteristic of the present invention is that at least part of the wiring 5 formed in the pixel region is covered at its upper part with a conductor 6' whose potential is fixable., i.e., the in-pixel-region shield 6'. A terminal 21 is a connecting terminal for keeping the shield 6' to a reference voltage Vref.

Usually, pixel regions of photodetectors have a structure wherein the light is incident from the outside of photoelectric conversion devices, and hence tend to be affected with noises which are radiated from the outside like the light. Especially in the case of photoelectric conversion devices used in contact type image sensors, it is common to use a mounting method in which a plurality of pixel regions are mounted on a common substrate such as a glass epoxy substrate or a ceramic substrate and thereafter the top of the photoelectric conversion device is coated with silicone resin or the like. Hence, each pixel region of the photoelectric conversion device is not electrically shielded at its upper part, and tends to be affected with the noises radiated from the outside.

In addition, in order to improve carrier collection efficiency and also make as low as possible the capacitance of the photoelectric conversion area, i.e., the pixel region, the anode or cathode of a photodiode is formed at the middle of the opening (pixel region opening) or at a position a little deviating from the middle toward an edge of the opening. In such an instance, any conductor whose potential has been fixed is not present in the vicinity of the conductor connected electrically to the anode or cathode of a photodiode, and hence the node of the pixel region that stands floating during the accumulation of carriers acts as an antenna to tend to be affected with the noises radiated from the outside.

Now, as shown in FIG. 1, in order to make the pixel region have a low capacitance, an opening is formed in the second metal layer light-screening layer 6 at the top of the pixel region, and some part of the top of the wiring 5 (the part extending into the pixel region) is not covered with the second metal layer 6. With regard to this part, however, the second metal layer shield layer 6' is provided above the wiring 5. Hence, the greater part of the noises radiated from the outside is cut off and absorbed at the second metal layer 6', so that the first metal layer wiring 5, i.e., the node, connected to the photodiode is less affected.

Thus, the second metal layer 6' extending into the opening of the light-screening layer 6 does not completely cover the first metal layer wiring 5 as shown in FIG. 2, but can sufficiently be effective.

Figure 3:
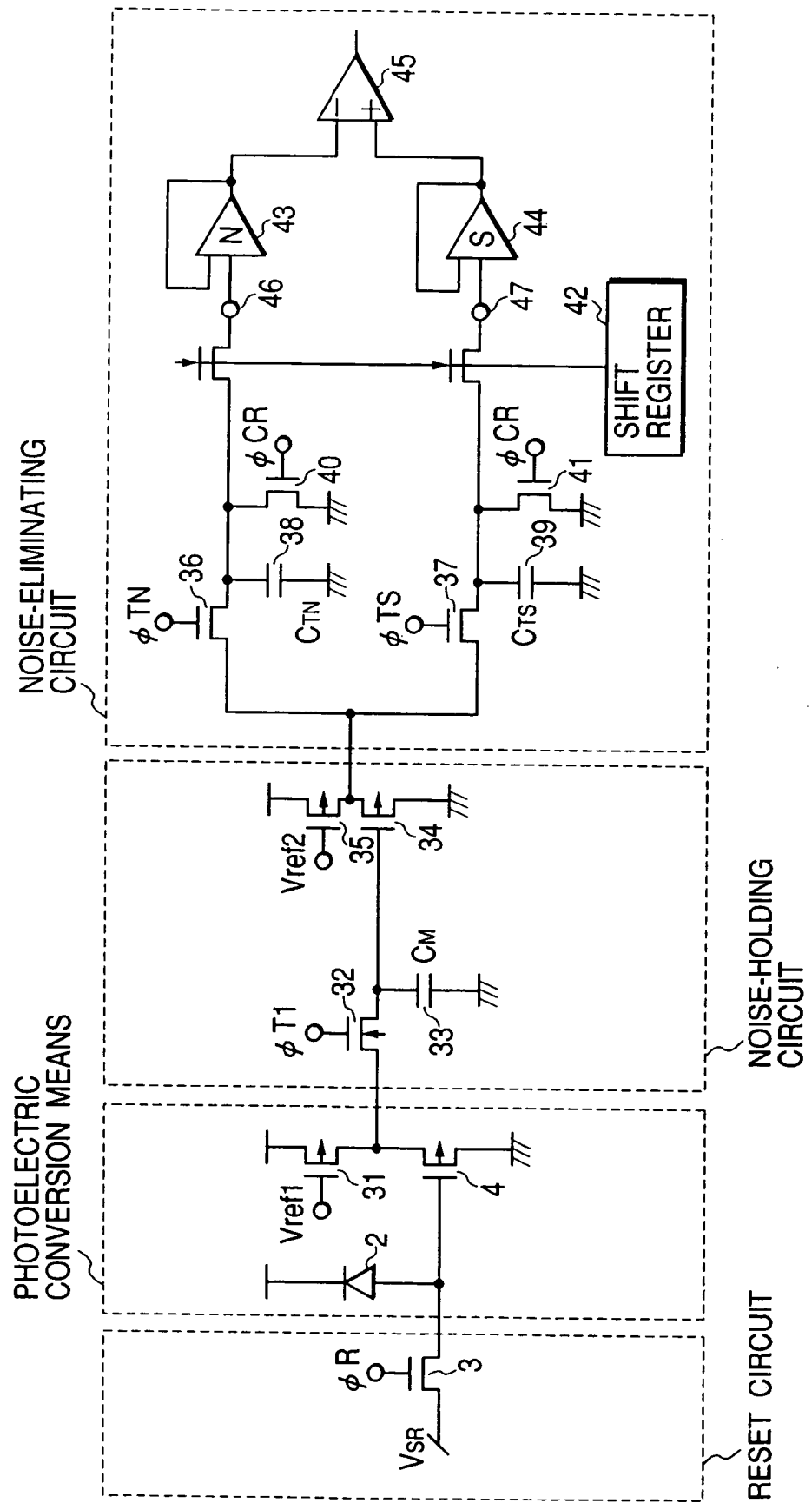
FIG. 3 shows a circuit diagram of the photoelectric conversion device according to the present invention.
Figure 4:
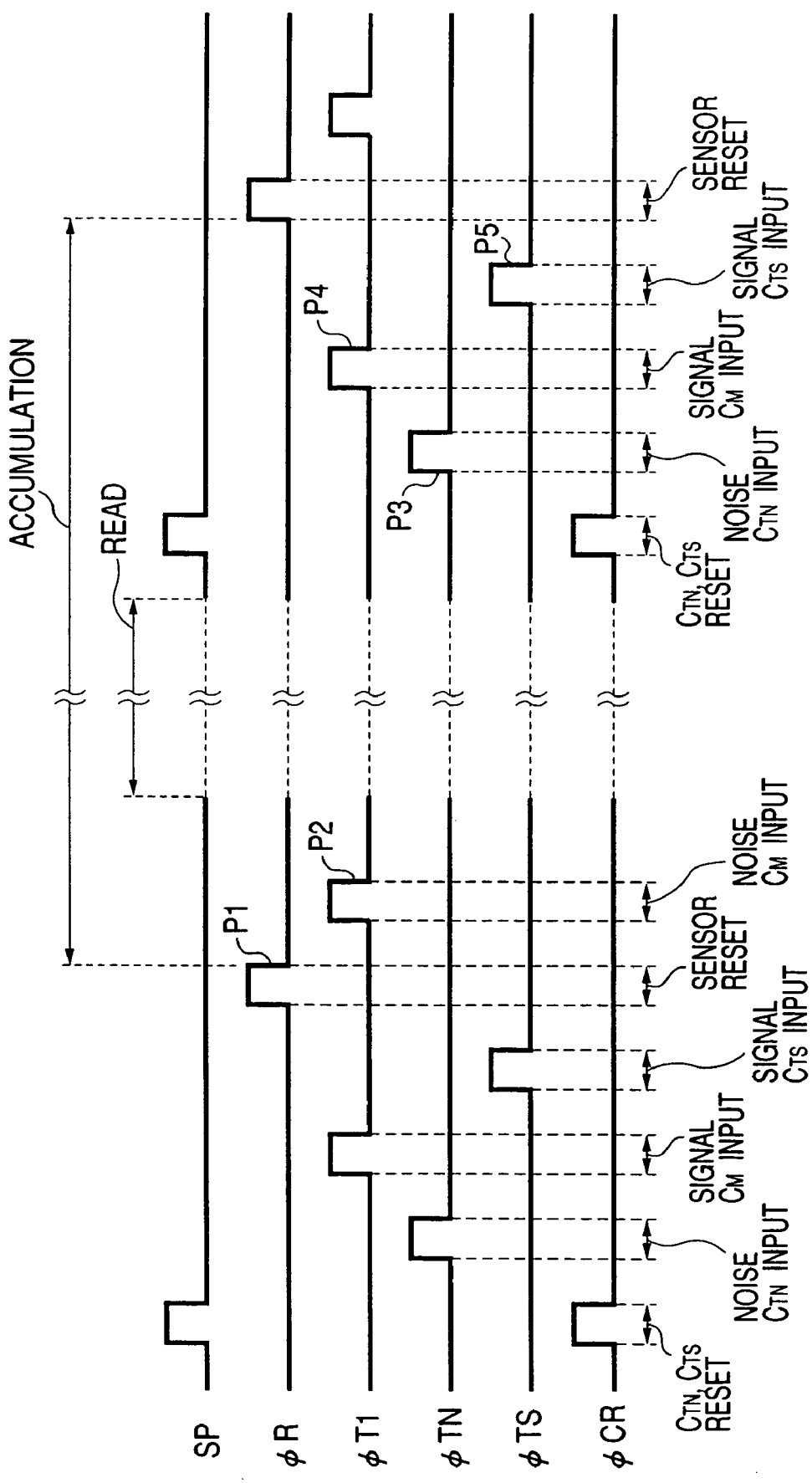
FIG. 4 is a drive timing chart.

FIGS. 3 and 4 are a circuit diagram and a drive timing chart, respectively, of the photoelectric conversion device according to the present embodiment.

The photoelectric conversion device according to the present embodiment has, as shown in FIG. 3, a photodiode 2 serving as a photoelectric conversion means, MOS transistors 4 and 31, a switch 3 serving as a reset circuit of the photoelectric conversion means 2, MOS transistors 32, 34 and 35 serving as noise holding means that hold the noise occurring at the time of the resetting of the photoelectric conversion means, and a capacitor ($C_M$) 33, and has a noise-eliminating (noise reduction) circuit (constituents 36 to 47) which eliminates (reduces) noise from the signals accumulated by the photoelectric conversion means, after the same above resetting and by using the noise kept being held in the noise-holding means.

The noise-eliminating circuit has an MOS switch 36 as a noise read means which reads electric charges of the noise occurring immediately after the resetting, a capacitor ($C_{TN}$) 38, an MOS switch 37 as a light-signal read means which reads light-signal electric charges after accumulation of light signals, a capacitor ($C_{TS}$) 39, and a shift register 42 serving as a scanning means which successively scans the noise of the above noise read means and the light signals of the above light-signal read means. By this scanning means, signals are read out of the noise read means (36, 38) and the light-signal read means (37, 39), and simultaneously the light signals are accumulated by the above photoelectric conversion means.

This photoelectric conversion device also has a noise-holding circuit (consisting of the MOS transistors 32, 33, 34 and the capacitor 35) which holds the noise occurring immediately after the resetting, until the light signals accumulated after the same resetting are read to the light-signal read means (37, 39); buffer amplifiers 43 and 44 serving as means for outputting the noise occurring immediately after the resetting, kept being held in the noise-holding circuit, and the light signals after the same resetting; and a differential amplifier 45.

To the shield 6', a power-source voltage is applied through the connecting terminal 21, and the shield 6' is grounded.

Here, the MOS transistors 34 and 35 and the MOS transistors 4 and 31 form MOS source followers, respectively.

Input terminals 46 and 47 of the buffer amplifiers 43 and 44 are connected with common output wires. Circuits without the shift register 42, the buffer amplifiers 43, 44 and the differential amplifier 45 are wired correspondingly to the bits (correspondingly to the number of pixels).

In the present embodiment, the components shown in the drawing are all formed on the same semiconductor substrate.

How the photoelectric conversion device according to the present embodiment operates will be described below with reference to a timing chart shown in FIG. 4.

Upon the inputting of a start pulse SP, first the capacitors $C_{TS}$ and $C_{TN}$ for accumulating light signals and noise, respectively, are reset.

Subsequently, a drive pulse φTN is applied and the noise kept being held in the capacitor $C_M$ is read to the capacitor $C_{TN}$. At this time, the noise read out of the capacitor $C_M$ is noise occurring immediately after a sensor has been reset in a previous field. After the noise has been read to the capacitor $C_{TN}$, a drive pulse φT1 is applied and light signals are read to the capacitor $C_M$. Also, a drive pulse φTS is applied and light signals are read to the capacitor $C_{TS}$.

Thereafter, a drive pulse φR is applied to reset the sensor. Thus, the anode of the photodiode having been kept to stand floating is reset to a stated resetting reference potential. Subsequently, the drive pulse φT1 is applied and signals occurring immediately after the sensor has been reset are read to the capacitor $C_M$ as reset noise, where the sensor begins accumulation. Thus, the anode is made to stand floating and accumulates holes (positive holes) among photoelectric carriers.

Then, at the same time the sensor performs accumulation, the light signals and noise held in the capacitors $C_{TS}$ and $C_{TN}$, respectively, are sequentially outputted to the common output wires. Thus, finally the light signals and noise are subtraction-processed (noise is subtracted from light signals) by a subtraction-processing circuit (not shown) and are outputted as net light signals.

Hence, the noise occurring upon the resetting of the sensor, which is ascribable to a reset pulse P1 as shown in the timing chart, is held in the capacitor $C_M$ by a pulse P2 during the accumulation, and is inputted to the capacitor $C_{TN}$ by a pulse P3 before the light signals are read. Thus, the results of subtraction of the noise against the same sensor from the light signals inputted by pulses P4 and P5 can be outputted as net light signals, and hence the sensor reset noise can completely be eliminated.

The noise-eliminating circuit is by no means limited to the embodiment described above. For example, any known clamping circuit may also be used.

The photoelectric conversion device having the structure as shown in FIGS. 1 to 4 and a photoelectric conversion device of a comparative example having the same structure as the above except that the shield 6' is omitted were put to an experiment to compare their effects against radiated noise.

Here, the noise source was in a frequency of 50 Hz. The noise having a frequency component of 50 Hz outputted from each photoelectric conversion device was measured, setting the electric field between the photoelectric conversion device and that of the noise source as parameters. Results obtained are shown in Table 2.

TABLE 2

| Noise electric field | Present embodiment (mV rms) | Comparative example (mV rms) |
|---|---|---|
| 0 V | 0.32 | 0.32 |
| 50 V | 0.36 | 1.75 |
| 100 V | 0.60 | 3.61 |

As can be seen from the foregoing, a remarkable effect is seen under a noise electric field intensity of 50V. Also, under a noise electric field intensity of 100V, the present embodiment brings the noise to a level of about ⅙ of that of the comparative example.

As shown in the foregoing, shielding only the necessary minimum portion in the opening of the photoelectric conversion device makes it possible to keep the pixel region from having a large capacitance and also to attain a sufficient shield effect against radiated noise. Needless to say, when the pixel region has room for capacitance in designing, the wiring 5 to which the photodiode is connected and the top of its node may completely be covered with the second metal layer conductor (shield) 6' having a stated potential.

In the present embodiment, the wiring 5 and the shield 6' are constituted of metal layers such as aluminum layers, and hence substantially has the function of light screening. The part called the pixel region or the opening in the present invention is a square opening part defined by corners a, b, c and d in FIG. 1. Also, this shield 6' extends into the square opening part from an edge. Thus, the opening is kept not to have a large capacitance and a small opening ratio.

(Embodiment 2)

The present embodiment shows an example in which the photoelectric conversion device shown in Embodiment 1 is used to construct a contact type image sensor and the contact type image sensor is further applied to an image input system.

Figure 5:
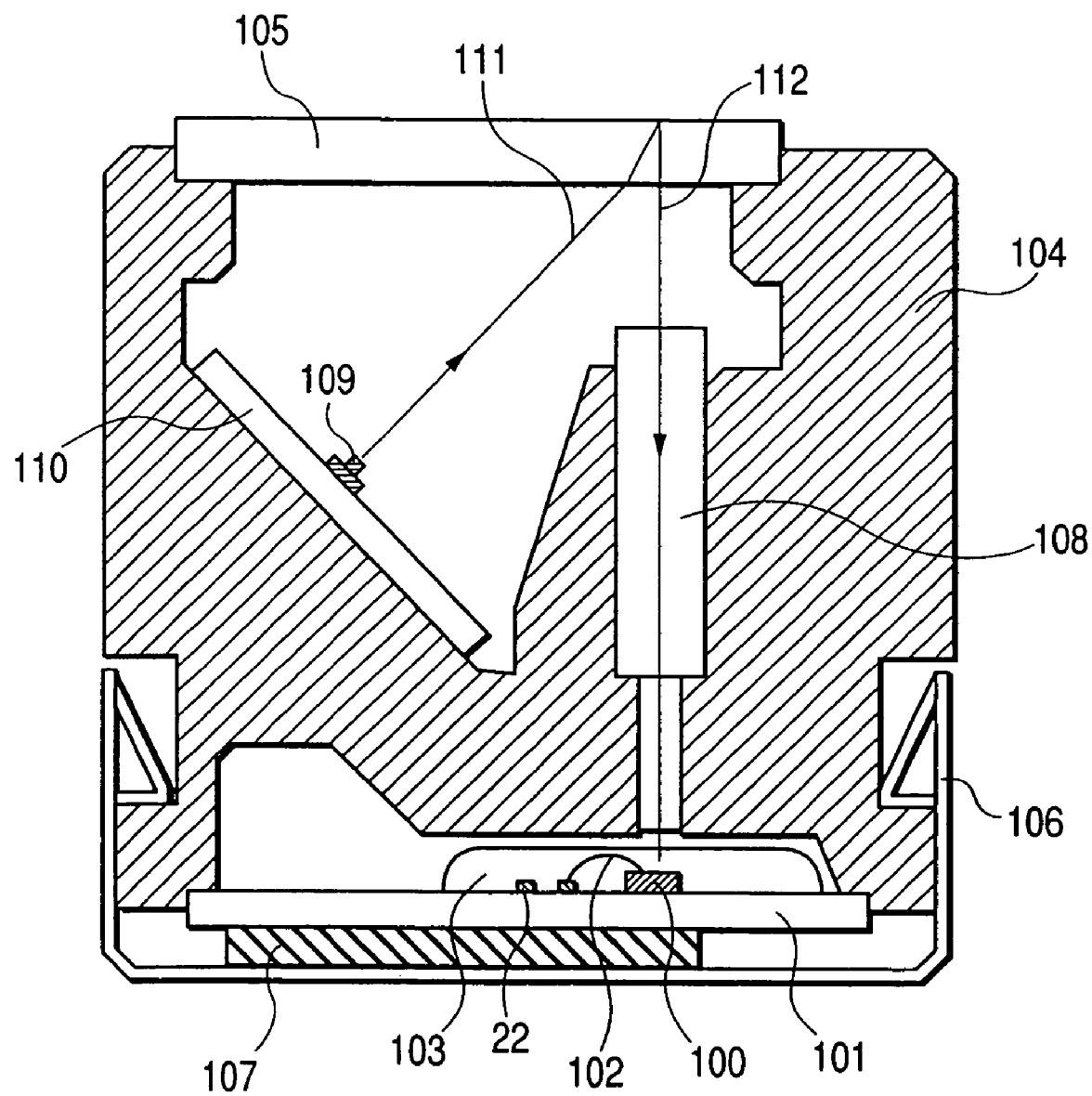
FIG. 5 is a cross-sectional view of a contact type image sensor unit in Embodiment 2 of the present invention.

FIG. 5 is a cross-sectional view of a contact type image sensor unit constructed using the photoelectric conversion device shown in Embodiment 1.

As shown in FIG. 5, at the top of a housing 104, a transparent glass plate 105 as an original-holding means is provided which is to come in contact with the face of an original. Also, an LED light source 109 is provided inside the housing 104 in the state it is attached to an LED mounting substrate 110; the light source 109 being provided at an angle so preset that emitted light 111 reflects from the face of an original placed in contact with the top surface of the transparent glass sheet 105.

A plurality of photoelectric conversion device 100 IC chips are arranged in a row or in a zigzag fashion on a sensor mounting substrate 101. A lens array 108 which is an imaging device for forming an image on the photoelectric conversion device 100 is also provided inside the housing 104.

The photoelectric conversion device 100 is electrically connected to a desired circuit of the sensor mounting substrate 101, and is covered with a protective member 103. Here, as the protective member, usable are light-transmitting insulating materials such as silicone resin, epoxy resin and polyimide resin. The sensor mounting substrate 101 is provided with wiring 22 such as a power-source line and a grounding line, for applying a reference potential to the connecting terminal 21 (FIG. 1).

The sensor mounting substrate 101 is also supported on a bottom plate 106 via a rubber sheet 107, the bottom plate 106 being engaged in the housing 104. The housing 104 is also provided with a connector for connecting the device to the exterior, e.g., to a scanner main body or a facsimile main body. Through the connector, electric power, control signals and so forth are inputted or outputted.

In the case of an image sensor unit which reads color images, the LED light source 109 has at least three color LEDs where, e.g., red, green and blue LEDs are assembled. At the time the LED light source 109 is emitting red light only, the photoelectric conversion device 100 is driven to read red-color information. Next, only the green-color LED is put on to read green-color information. Finally, only the blue-color LED is put on to read blue-color information. A color image can be read by combining these information.

Here, the unit shown in FIG. 5 has a structure wherein the protective member 103, lens array 108 and transparent glass sheet 105 are provided above the opening of the photoelectric conversion device 100. Since these are commonly members having insulating properties, they can not have any shielding effect against the radiated noise occurring on the outside, and the noise can easily reach the opening part of the photoelectric conversion device 100. However, the use of the photoelectric conversion device of the present invention makes it possible to materialize a contact type image sensor that may hardly be affected with the noise.

Figure 6:
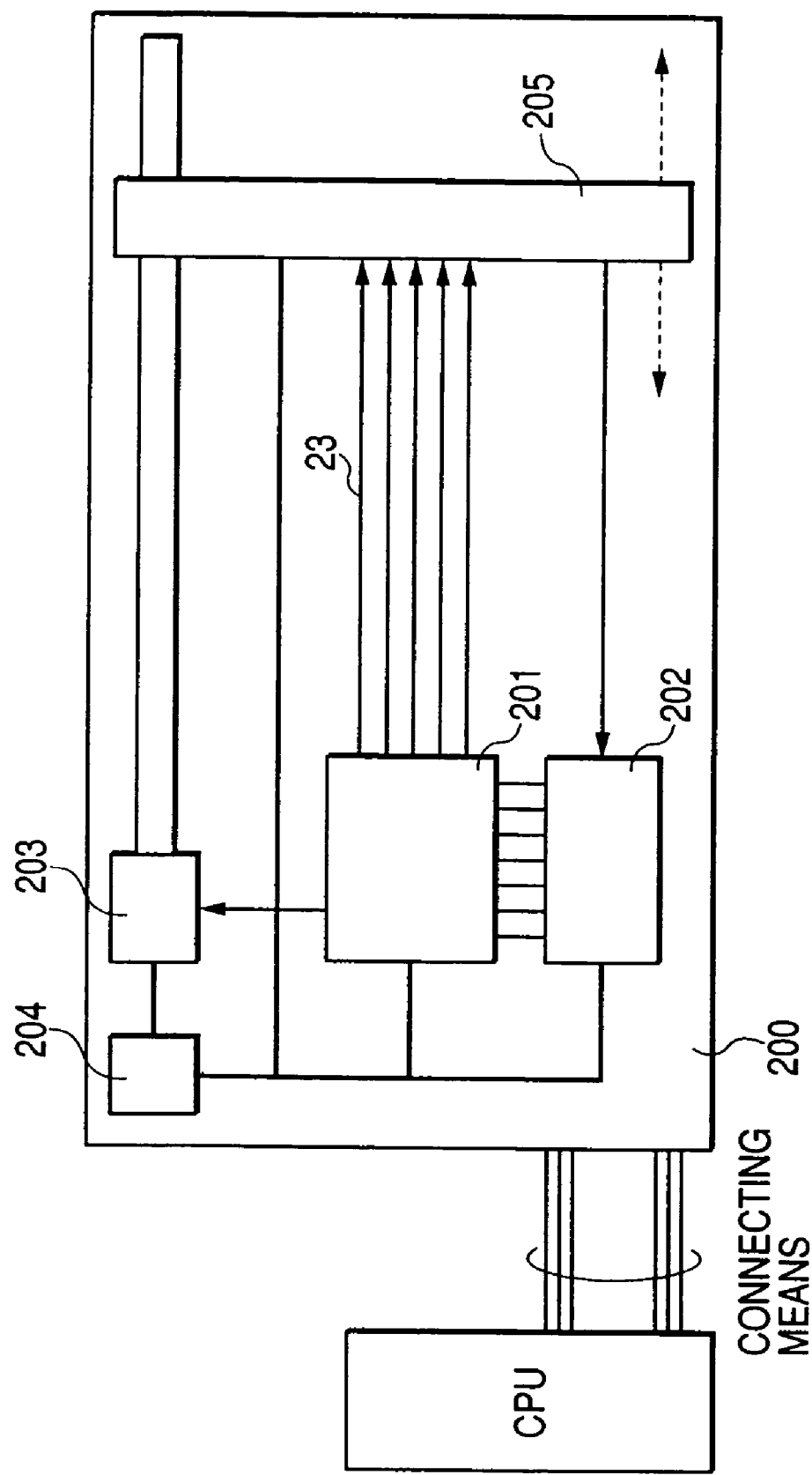
FIG. 6 is a block diagram of an image input system in Embodiment 2 of the present invention.

FIG. 6 shows an example of an image input system employing the image sensor according to the present invention.

This image input system, 200, is constituted chiefly of a sensor drive means 201 for electrically driving the photoelectric conversion device and light source set in a contact type image sensor unit 205, a signal processing means 202 for processing signals outputted from the contact type image sensor unit 205, a sensor position control means 203 for controlling the position of secondary scanning of the contact type image sensor unit 205, and a power-source means 204 for supplying power-source voltage to the above electric component parts, and also is so set up that its operation is controlled by a CPU serving as a control circuit. Also, e.g., lines 23 serve as power-source lines (or grounded lines) through which a reference voltage is applied to keep the shield 6' being held at a reference potential. The reference voltage is supplied from the power-source means 204.

In the present embodiment, the sensor position control means 203 may be constituted of, e.g., mechanism component parts such as a stepping motor, a shaft and a belt which are used in combination. In the present embodiment, an example is shown in which the original is placed on an original stand having a glass-plate top and the image sensor is moved in the secondary-scanning direction to perform scanning. Also usable is an image read system of a type in which the image sensor is set stationary and the original is held between the transparent glass plate 105 and an original-holding-down member (not shown) and moved in the secondary-scanning direction, i.e., what is called a sheet-feeding type. In this instance, the original-holding means is constituted of the transparent glass plate 105 and the original-holding-down member.

Here, using the photoelectric conversion devices of the present invention and of the comparative example, described in Embodiment 1, the contact type image sensors were set up and were each applied in the above image input system to read images. As a result, in images read by the contact type image sensor of the comparative example, periodic lateral stripes appeared in the direction perpendicular to the secondary-scanning direction. However, in images read by the contact type image sensor of the present invention, such stripe-like difficulties did not occur.

Stated more specifically, in the image input system shown in FIG. 6, the use of the photoelectric conversion device of the present invention has solved the problem that the image quality deteriorates because of the noise radiated from the power-source means 204 or sensor position control means 203 and the low-frequency noise radiated from the outside of the image input system 200.

In other words, according to the present embodiment, a large margin of designing can be taken for measures against the radiated noises occurring in power sources and drive sources used in image read instruments. Hence, an image input system which can obtain high-quality images can be materialized at a low cost.

(Embodiment 3)

Figure 7:
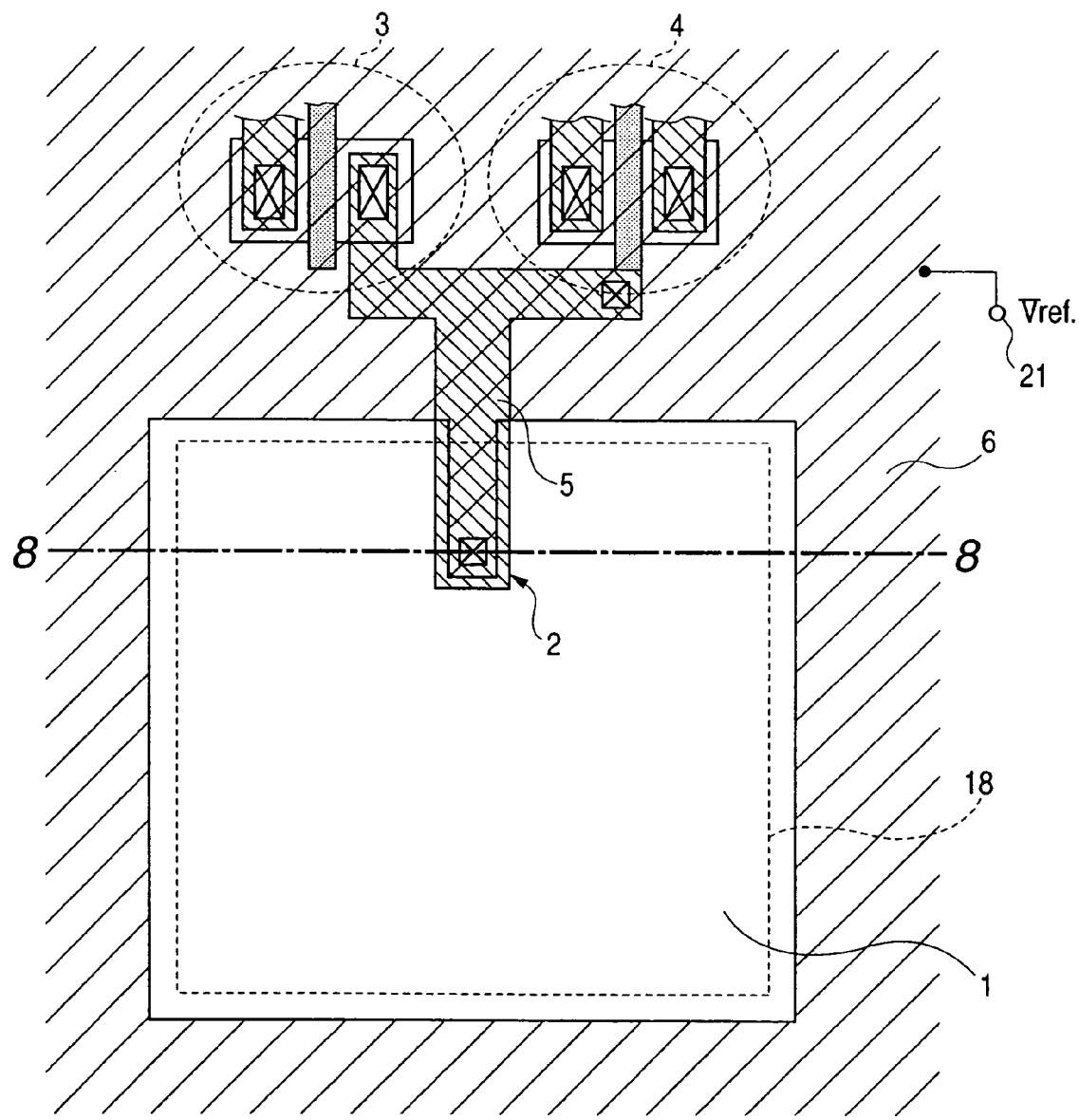
FIG. 7 illustrates a planar structure of a photodetector in Embodiment 3 of the present invention.
Figure 8:
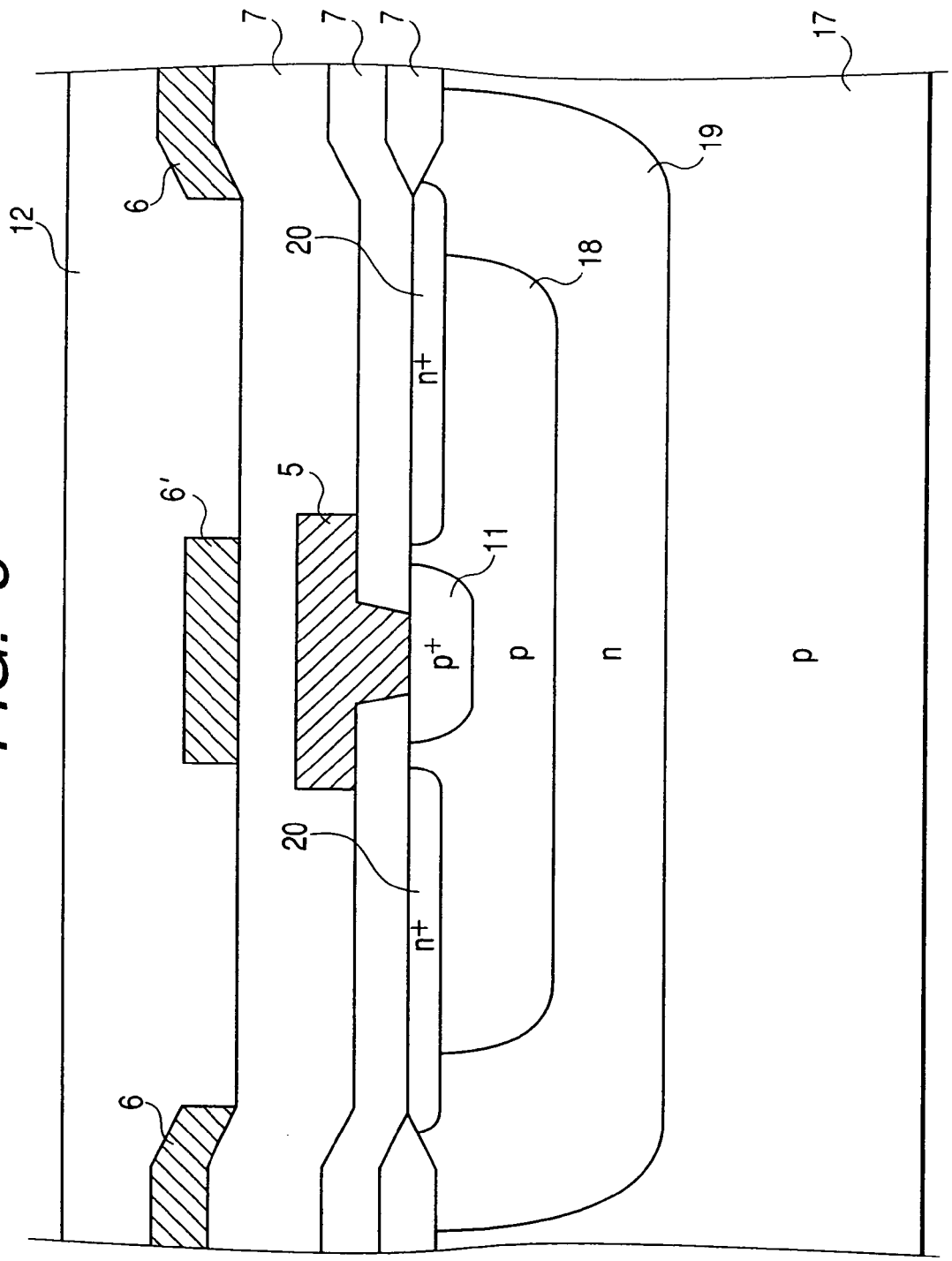
FIG. 8 is a cross-sectional view along the line 8—8 in FIG. 7.

FIG. 7 illustrates a planar structure of a photodetector as a photoelectric conversion device according to another embodiment of the present invention. FIG. 8 shows a cross-sectional structure along the line 8—8 in FIG. 7.

The present embodiment shows an example of a photodetector embodied differently from that in Embodiment 1. As shown in FIGS. 7 and 8, a p-type region 18 of a buried photodiode serving as the photodetector is formed in a pixel region 1. A $p^+$-type region 11 is formed in the p-type region 18 of this photodiode, which is electrically connected to the drain of a reset MOS transistor 3 and the gate of an amplifying source follower MOS transistor 4 through a wiring 5 formed of a first metal layer. Also, the pixel region 1 of the photodetector corresponds to an opening defined by a light-screening layer 6 formed of a second metal layer and this light-screening layer 6 is connected to a power source so as to be kept at a stated reference potential.

As shown in FIG. 8, the p-type region 18 is formed in the pixel region 1 of an n-type region 19 provided on a p-type semiconductor substrate 17. Also, in the p-type region 18 in the n-type region 19, a $p^+$-type region 11 is provided in an island shape.

On the surface of the p-type region 18, an $n^+$-type surface region 20 is provided which separates the p-type region 18 from the underside of an insulating layer lying above that region. This region 20 stands adjoining to the n-type region 19 at the periphery of the pixel region 1, and is electrically connected thereto.

Thus, a photodiode is formed by the p-n junction between the p-type region 18, the n-type region 19 and the n$^+$-type surface region 20. Among photoelectric carriers formed by photoelectric conversion in the photodiode, holes are collected in the p$^+$-type region 11 to cause a change in potential of the wiring 5 formed of a first metal layer.

The p$^+$-type region 11 is further electrically connected with the wiring 5 formed of a first metal layer. Above the wiring 5, an in-pixel-region shield 6' formed of a second metal layer is provided via an insulating layer 7, and a protective layer 12 is provided above the second metal layer.

Here, in the photodetector shown in FIG. 8, in order to lower the capacitance of the device, the n-type region 19 and the n$^+$-type surface region 20 have their own impurity densities so that the p-type region 18 held between them is depleted during the operation of the photodetector.

Using the photoelectric conversion device shown in FIGS. 7 and 8 and a photoelectric conversion device of a comparative example in which the shield 6' is not provided, circuits were constructed as shown in FIG. 3, to compare their effects against radiated noises. As a result, the same results as in the case of Embodiment 1 were obtained.

Figure 9:
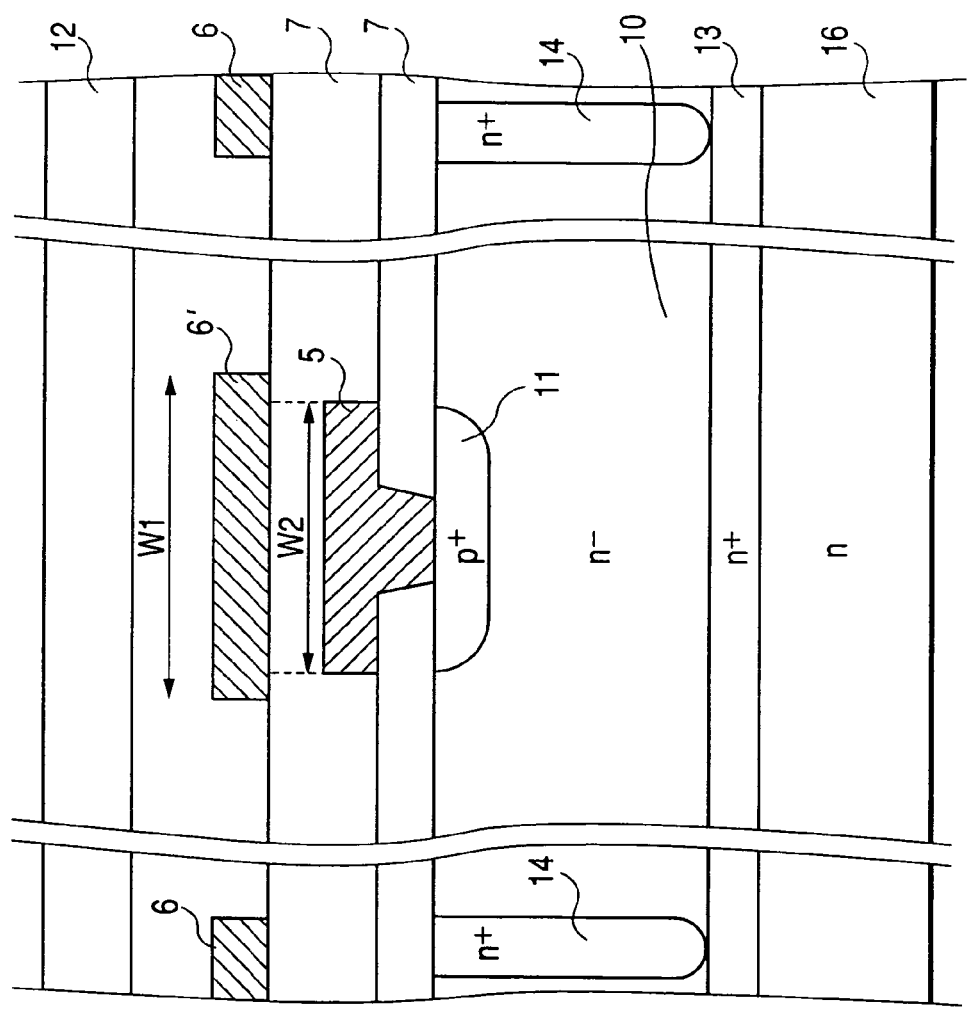
FIG. 9 is a cross-sectional view of a photoelectric conversion device according to another embodiment of the present invention, showing its pixel region and the vicinity thereof.

FIG. 9 is a cross-sectional view of a photoelectric conversion device according to still another embodiment of the present invention, showing its pixel region and the vicinity thereof.

This device has a construction different from that in FIG. 1 in that the shield 6' has a width W1 a little larger than a width W2 of the wiring 5. Of course, W1 may be equal to W2.

As the first and second metal layers 5, 6 and 6' used in the present invention, usable are single layers or multiple layers comprised of a metal selected from the group consisting of gold, aluminum, copper, molybdenum, tungsten, titanium and tantalum. An alloy composed chiefly of some of the above metals may also be used, as exemplified by Al—Cu, Al—Si—Cu, Ti—W or W—Mo.

The insulating layer 7 used in the present invention may be formed of a insulator such as silicon oxide or silicon oxide nitride, or an insulator with a low dielectric constant, such as fluorine-containing silicon oxide or an organic insulator, which is formed by CVD (chemical vapor deposition) or coating.

The n$^+$-type region 14 may also be replaced with an insulator or a p-type device-separating region.

The pixel region is an opening which may be in the form of a square or polygon having a side of from 1 µm to 80 µm. The shield 6' may have a width of from 0.18 µm to 20 µm.

In all Embodiments described above, the p$^+$-type region 11 is provided in an island shape in the n$^-$-type region 10 to form the photodiode. Alternatively, their conductivity type may all be reversed so that the n-type region is provided in the p-type region to form a photodiode.

The p$^+$-type region 11 also need not necessarily have a square island shape. For example, it may have the shape of a rectangle, a cross or a ring, any of which is applicable, and may be so designed as to attain optimum characteristics, taking account of carrier collection performance and photodetector capacitance.

As described above, the constitution of the present invention makes it possible to materialize a photoelectric conversion device that may hardly be affected with radiated noises, in particular, a low-frequency radiated noise typified by power-source noise, and can read images in a high quality. The application of the present invention makes it possible to achieve cost reduction of photoelectric conversion devices, contact type image sensors and image input systems and at the same time to achieve high-quality imaging.

What is claimed is:

1. A contact type image sensor unit comprising:
   a light source;
   an imaging device; and
   a photoelectric conversion device, said photoelectric conversion device comprising:
   a first-conductivity type first semiconductor region located in a pixel region;
   a second-conductivity type second semiconductor region provided in the first semiconductor region and capable of accumulating photoelectric carriers in a floating state, wherein said first and second semiconductor regions form a photodiode;
   a wiring for electrically connecting directly the second semiconductor region to a gate of an amplifying source follower MOS transistor located outside the pixel region; and
   a conductor maintained at a predetermined potential and disposed over one side of said wiring within the pixel region, wherein said wiring, an insulator, and said conductor are stacked in order from a side of the second semiconductor region so that said conductor does not contact said wiring, and the one side of said wiring is opposite to a side of said wiring at which said wiring is connected to said second semiconductor region.

2. The image sensor according to claim 1, wherein the photoelectric conversion device is provided in plurality in a one-dimensional fashion or staggered fashion on a mounting substrate.

3. The image sensor according to claim 1, which further comprises a wiring for supplying a reference voltage for keeping the conductor at a stated potential.

4. An image input system comprising:
   an original-holding means for holding an original;
   the image sensor according to claim 1; and
   a control circuit for controlling the image sensor.

5. The image input system according to claim 4, wherein the original-holding means is an original stand having a transparent top surface, or an original-carrying holding-down member.

6. The image input system according to claim 4, which further comprises a reference voltage source that supplies a reference voltage for keeping the conductor at a stated potential.

* * * * *